United States Patent
Rao et al.

(10) Patent No.: US 11,315,876 B2
(45) Date of Patent: Apr. 26, 2022

(54) THIN FILM CONDUCTIVE MATERIAL WITH CONDUCTIVE ETCH STOP LAYER

(71) Applicant: GLOBALFOUNDRIES Singapore Pte. Ltd., Singapore (SG)

(72) Inventors: Xuesong Rao, Singapore (SG); Yun Ling Tan, Singapore (SG); Yudi Setiawan, Singapore (SG); Siow Lee Chwa, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/792,854

(22) Filed: Feb. 17, 2020

(65) Prior Publication Data

US 2021/0257300 A1 Aug. 19, 2021

(51) Int. Cl.
*H01L 23/535* (2006.01)
*H01L 23/532* (2006.01)
*H01L 21/768* (2006.01)

(52) U.S. Cl.
CPC ...... *H01L 23/535* (2013.01); *H01L 21/76805* (2013.01); *H01L 21/76829* (2013.01); *H01L 21/76895* (2013.01); *H01L 23/53257* (2013.01)

(58) Field of Classification Search
CPC .......... H01L 21/76805; H01L 23/5228; H01L 23/5226; H01L 23/53204; H01L 23/53209; H01L 23/53257; H01L 21/76829; H01L 21/76832; H01L 21/76841; H01L 21/76849; H01L 21/7685
See application file for complete search history.

(56) References Cited

U.S. PATENT DOCUMENTS

| | | | |
|---|---|---|---|
| 6,734,076 B1 | 5/2004 | Jaiswal et al. | |
| 8,080,461 B2 | 12/2011 | Yeh et al. | |
| 8,860,181 B2 | 10/2014 | Wei et al. | |
| 9,136,216 B2 | 9/2015 | Nishimura et al. | |
| 9,502,284 B2 | 11/2016 | Ali et al. | |
| 2015/0162396 A1* | 6/2015 | Yagi | H01L 23/5223 257/532 |
| 2016/0218062 A1* | 7/2016 | Aggarwal | H01L 21/76816 |
| 2017/0207226 A1* | 7/2017 | Lee | H01L 27/11573 |

OTHER PUBLICATIONS

Randall Brynsvold et al., Constant-Current Stressing of SiCr-Based Thin Film Resistors: Initial "Wearout" Investigation, IIRW Final Report, 2006, 37-43, IEEE, New Jersey, United States.
Young-ChEon Kwon et al., Process Optimization of Integrated SiCr Thin-Film Resistor for High-Performance Analog Circuits, IEEE Transactions on Electron Devices, Jan. 2014, 8-14, vol. 61, No. 1, IEEE, New Jersey, United States.
Yuan Li et al., A novel degradation mechanism in SiCr—O based thin film resistors under temperature and current stress, 2012, 1-6, IEEE, New Jersey, United States.

\* cited by examiner

*Primary Examiner* — Thanhha S Pham
(74) *Attorney, Agent, or Firm* — Anthony Canale (57) ABSTRACT

A structure comprises a substrate and a conductive pad disposed over the substrate. A conductive layer overlies the conductive pad. A via is disposed over the conductive pad. The via penetrates through the conductive layer and touches a surface of the conductive pad.

19 Claims, 8 Drawing Sheets

THIN FILM CONDUCTIVE MATERIAL WITH CONDUCTIVE ETCH STOP LAYER

FIELD OF THE INVENTION

The disclosed embodiments relate generally to semiconductor devices having a thin film conductive material with a conductive etch stop layer and the manufacture thereof.

BACKGROUND

Semiconductor devices include a variety of passive and active components such as transistors, resistors, conductors and capacitors. The devices are scaled to smaller dimensions to increase the number of devices that can be accommodated in a single chip, resulting in various processing and integration challenges.

Typical semiconductor devices include a stack of material layers such as dielectric layers, semiconductor layers, and other conductive layers. Contacts or vias are fabricated to electrically couple conductive layers through the stack. A typical device would include a conductive layer, a dielectric layer on the conductive layer, contacts or vias through the dielectric layer, the contacts or vias touching the conductive layer. The conductive layer may be a thin film conductive material made of a thin film of metal. The thin film of metal may have a thickness of at least 20 Å.

Fabricating contacts or vias to the thin film conductive material is challenging as the thin film of metal may be easily damaged during via etching. For example, via etching or chemical cleaning processes before via metal deposition may result in damage to the thin film of metal. The damage to the thin film of metal may cause the via to penetrate through or punch through the thin metal film. Chemical cleaning processes after the etching process may attack the thin film of metal resulting in poor electrical contact between the vias and the thin film conductive material. Hence, there is an urgent need to overcome the challenges mentioned above.

SUMMARY

In an aspect of the present disclosure, a structure is provided. The structure comprises a substrate and a conductive pad disposed over the substrate. A conductive layer overlies the conductive pad. A via is disposed over the conductive pad. The via penetrates through the conductive layer and touches a surface of the conductive pad.

In another aspect of the present disclosure, a structure is provided. The structure comprises a substrate. A first conductive pad and a second conductive pad are disposed over the substrate. A conductive layer overlies the first conductive pad and the second conductive pad. A first via is disposed over the first conductive pad and a second via is disposed over the second conductive pad. The vias penetrate through the conductive layer. The first via touches a surface of the first conductive pad and the second via touches a surface of the second conductive pad.

In yet another aspect of the present disclosure, a method of fabricating a structure is provided. The method comprises providing a substrate and forming a conductive pad over the substrate. A conductive layer is formed overlying the conductive pad. A via is formed over the conductive pad. The via penetrates through the conductive layer and touches a surface of the conductive pad.

Numerous advantages may be derived from the embodiments described below. The conductive pad provides reliable electrical contact to the conductive layer for the via. The conductive pad may be an etch stop layer for via etching processes and increase processing margin for the via.

BRIEF DESCRIPTION OF THE DRAWINGS

The disclosed embodiments will be better understood from a reading of the following detailed description, taken in conjunction with the accompanying drawings:

FIGS. 3A to 3H illustrate a fabrication process flow for a structure, according to embodiments of the disclosure.

FIGS. 4A to 4F illustrate a fabrication process flow for a structure, according to embodiments of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

Figure 1:
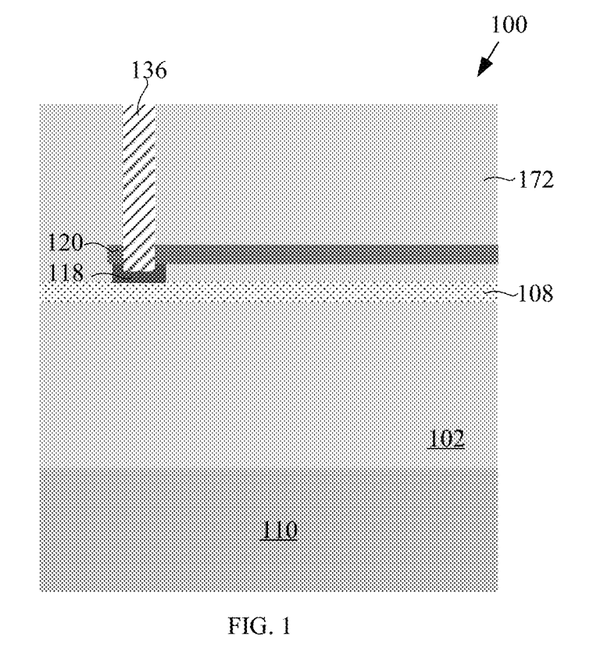
FIG. 1 is a cross-section view of a structure, according to embodiments of the disclosure.

FIG. 1 is a cross-section view of a structure 100, according to embodiments of the disclosure. Referring to FIG. 1, the structure 100 comprises a substrate 110 with a conductive pad 118 over the substrate 110. A conductive layer 120 overlies the conductive pad 118. A via 136 is disposed over the conductive pad 118. The via 136 penetrates through the conductive layer 120 and touches a surface of the conductive pad 118.

The conductive layer 120 may be larger than the conductive pad 118 in at least on lateral direction, the conductive layer 120 extending past the conductive pad 118. From a top-down perspective, the conductive pad 118 may have a generally circular, square or rectangular shape, the conductive layer 120 may be of a rectangular shape of a larger dimension than the conductive pad 118, the via 136 may be of a circular, oval, or an elongated bar shape. The conductive pad 118 may laterally be larger than the via 136. The conductive layer 120 may be part of a current path through an electrical device, for carrying or modifying an electrical signal propagating therethrough.

Referring to FIG. 1, a dielectric layer 172 may be disposed over the substrate 110. In embodiments, the dielectric layer 172 may be an interlayer dielectric (ILD) layer. The conductive pad 118, the conductive layer 120 and the via 136 may be disposed in the ILD layer 172. A dielectric etch stop layer 108 may separate the ILD layer 172 from an ILD layer 102. The ILD layer 102 may be disposed between the ILD layer 172 and the substrate 110. The term "etch stop layer" may be used to refer to a layer assisting in etching of a layer above the etch stop layer, and in particular assisting in ending the etching process.

Figure 2:
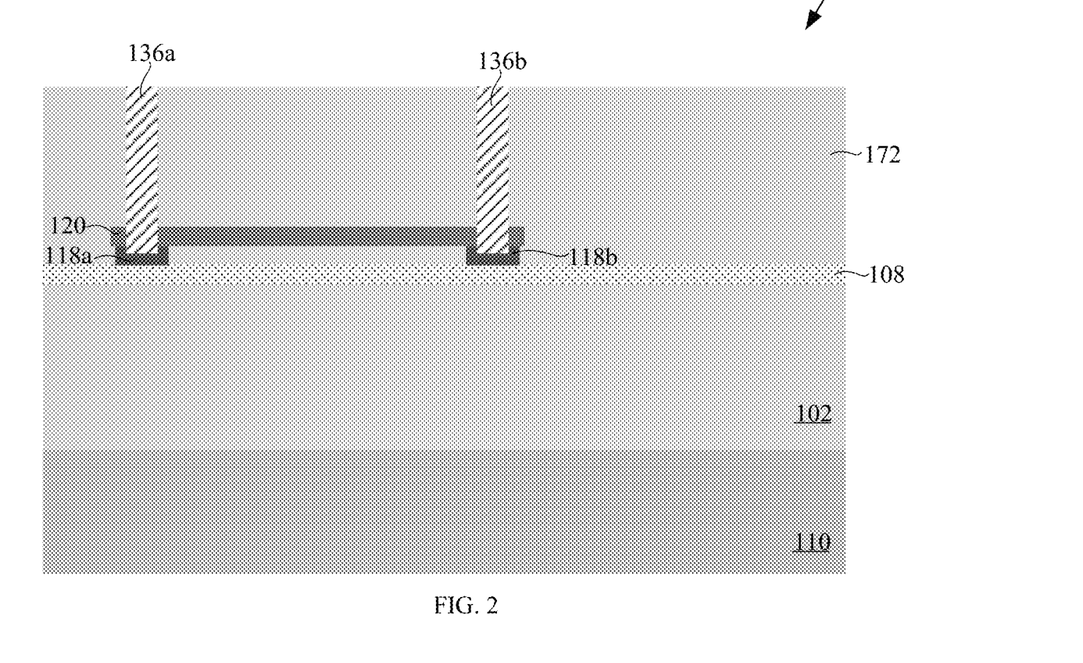
FIG. 2 is a cross-section view of a structure, according to embodiments of the disclosure.

The embodiment shown in FIG. 1 may be modified to form alternative embodiments within the scope of the disclosure. FIG. 2 is a cross-section view of a structure 200, according to embodiments of the disclosure. The same reference numbers used in FIG. 1 are also used in FIG. 2 for identical features. The conductive pad 118 and the via 136 in FIG. 1 are referred to as a first conductive pad 118a and a first via 136a, respectively, in FIG. 2. In contrast to FIG. 1, FIG. 2 shows a second conductive pad 118b, over the substrate 110. The conductive layer 120 overlies the second conductive pad 118b. A second via 136b is disposed over the second conductive pad 118b. The second via 136b penetrates through the conductive layer 120 and touches a surface of the second conductive pad 118b. The first and second conductive pads, 118a and 118b, respectively, the conductive layer 120 and the first and second vias, 136a and 136b, respectively, may be disposed in the ILD layer 172. In embodiments, an interconnect layer may be formed above the first and second vias, 136a and 136b, respectively. The interconnect layer may include trenches, contacts or vias.

Referring to FIG. 2, the conductive layer 120 extends between a first end portion and a second end portion, the second end portion opposing the first end portion, the first end portion overlying the first conductive pad 118a and the second end portion overlying the second conductive pad 118b. The second conductive pad 118b may be separated from the first conductive pad 118a by a portion of the ILD layer 172.

Thin film conductive materials may be used for a variety of devices. An example of a device using thin film conductive materials is a resistor. In embodiments, a thin film conductive material is a thin film of metal to achieve a target sheet resistance value. In embodiments, the thin film conductive material is a thin film of intermetallic compounds, alloys, polysilicon or metal-semiconductor compounds such as silicide. Such thin film may be desirable for an electronic device. The film may have a thickness ranging from 20 to 150 Å. The thickness of the film may be modified in order to meet sheet resistance target values for various applications. The structure 200 illustrated in FIG. 2 may be, among others, a conductive line or a resistor. The conductive line electrically coupling two points of a layer within a confined region. The resistor having a designed resistance to the passage of an electrical current. The structure 200 may be used within an electrical circuit to modify an electrical current there through. The structure 200 may be within an integrated circuit, for example an analog, radio frequency (RF), or other electronic parts.

The term "intermetallic" may be a substance composed of definite proportions of two or more elemental metals, rather than continuously variable proportions, as in solid solutions. The crystal structures and the properties of intermetallic compounds often differ markedly from those of their constituents.

The term "alloy" may be a metallic substance composed of two or more elements, as either a compound or a solution. The components of alloys may be metals.

In embodiments, the conductive layer 120 may be a thin film conductive material. In embodiments, the first and the second conductive pads, 118a and 118b, may be conductive etch stop layers. The structure 200 illustrated in FIG. 2 may include a thin film conductive material with conductive etch stop layers. A conductive etch stop layer refers to an etch stop layer made of a conductive material.

Figure 3A:
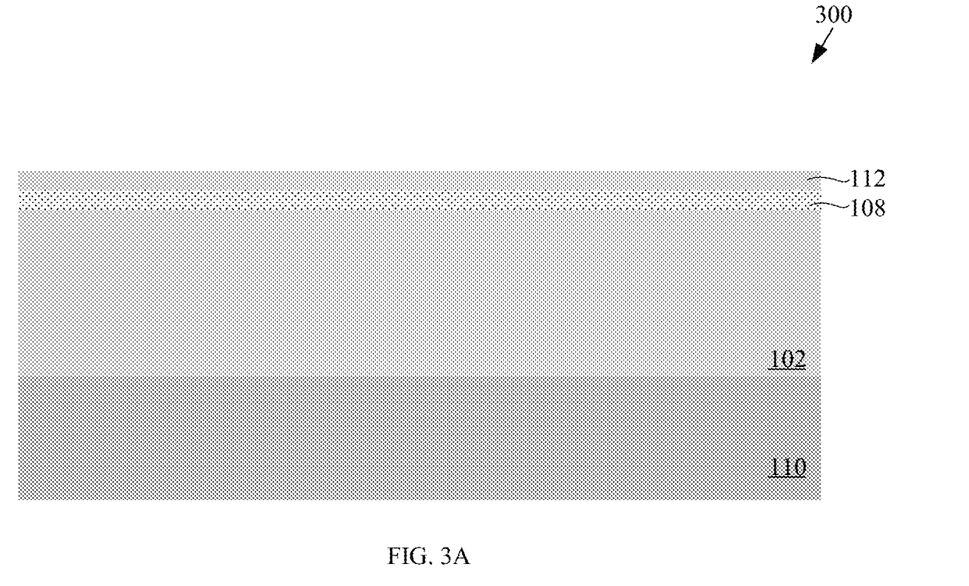
FIG. 3A is a cross-section view of a partially completed structure, according to embodiments of the disclosure.

FIGS. 3A to 3H illustrate a fabrication process flow for a structure 300 according to embodiments of the present disclosure. The same reference numbers used in FIG. 2 are also used in FIGS. 3A to 3H for identical features. FIG. 3A is a cross-section view of a partially completed structure 300, according to embodiments of the disclosure.

Referring to FIG. 3A, the substrate 110 may be provided. An ILD layer 102 may be provided over the substrate 110. A dielectric etch stop layer 108 may be deposited over the ILD layer 102. In embodiments, the substrate 110 may be made of monocrystalline silicon. The substrate 110 may include transistors, such as field effect transistors, having a source, a drain, and a gate. The substrate 110 may include one or multiple interconnect layers. The ILD layer 102 may be made of tetraethyl orthosilicate (TEOS), silicon dioxide, silicon oxynitride, borosilicate glass (BSG), phosphoric silicate glass (PSG), fluorinated silicate glass (FSG), low-k material, another suitable material or a combination thereof.

In embodiments, the dielectric etch stop layer 108 may be made of silicon nitride. The dielectric etch stop layer 108 may be deposited by chemical vapor deposition (CVD), atomic layer deposition (ALD), physical vapor deposition (PVD) or any other suitable deposition methods. An ILD layer 112 may be deposited over the dielectric etch stop layer 108.

The ILD layer 112 may be made of TEOS, silicon dioxide, silicon oxynitride, BSG, PSG, FSG, low-k material, another suitable material or a combination thereof. The ILD layer 112 may be deposited by CVD, ALD, PVD or any other suitable deposition methods. In embodiments, the ILD layer 112 has a thickness range between 300 Å and 600 Å. In embodiments, the ILD layer 112 has a thickness lower than 300 Å. In embodiments, the ILD layer 112 has a thickness thicker than 600 Å.

Figure 3B:
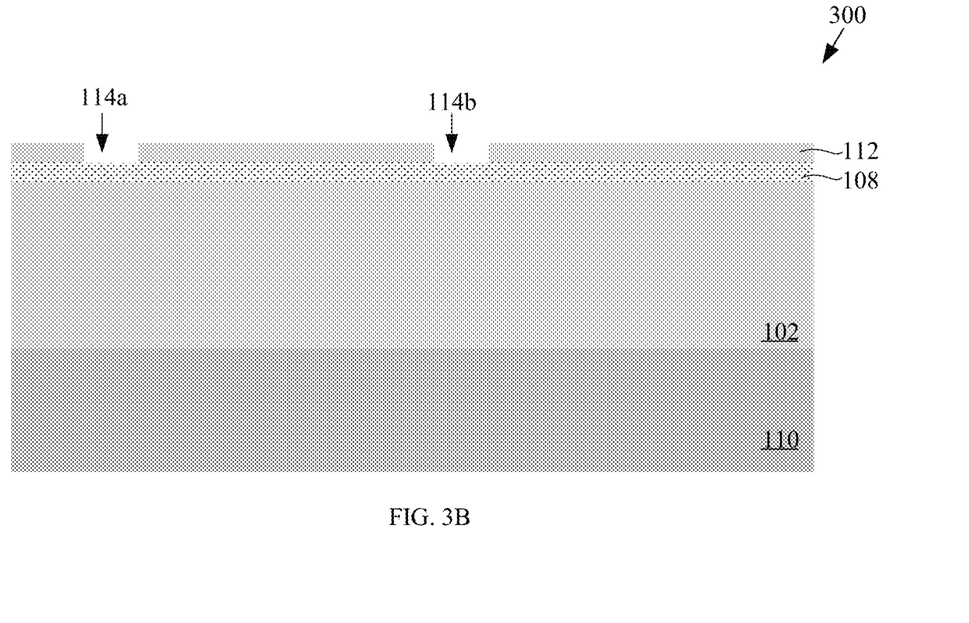
FIG. 3B is a cross-section view of a partially completed structure after formation of first and second openings, according to embodiments of the disclosure.

FIG. 3B is a cross-section view of a partially completed structure 300 after formation of first and second openings, 114a and 114b, respectively, according to embodiments of the disclosure. The first and second openings, 114a and 114b, respectively, may be formed in the ILD layer 112. Although not shown, the formation of the first and second openings, 114a and 114b, respectively, may include photolithography process, according to conventional methods. A photolithography process may include depositing a layer of photoresist material followed by conventional photoresist exposure and developing to form photoresist patterns. Etching processes may be used to remove portions of the ILD layer 112 not covered by the photoresist patterns. The etching processes may be a wet etch process, a dry etch process or a combination of dry and wet etch processes.

Figure 3C:
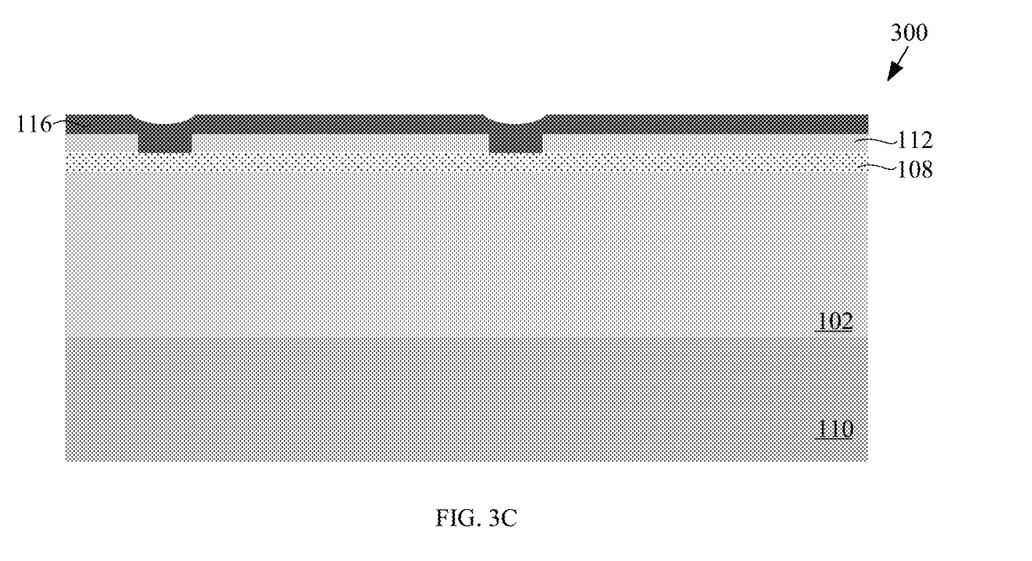
FIG. 3C is a cross-section view of a partially completed structure after deposition of a conductive material to fill the first and second openings, according to embodiments of the disclosure.

FIG. 3C is a cross-section view of a partially completed structure 300 after deposition of a conductive material 116, according to embodiments of the disclosure. The conductive material 116 may fill the first and second openings, 114a and 114b, respectively. The conductive material 116 may be deposited by CVD, PVD, ALD or any other suitable deposition methods. The conductive material 116 may be made of tantalum nitride (TaN), tantalum (Ta), titanium nitride (TiN), tungsten (W), another suitable material or a combination thereof.

Figure 3D:
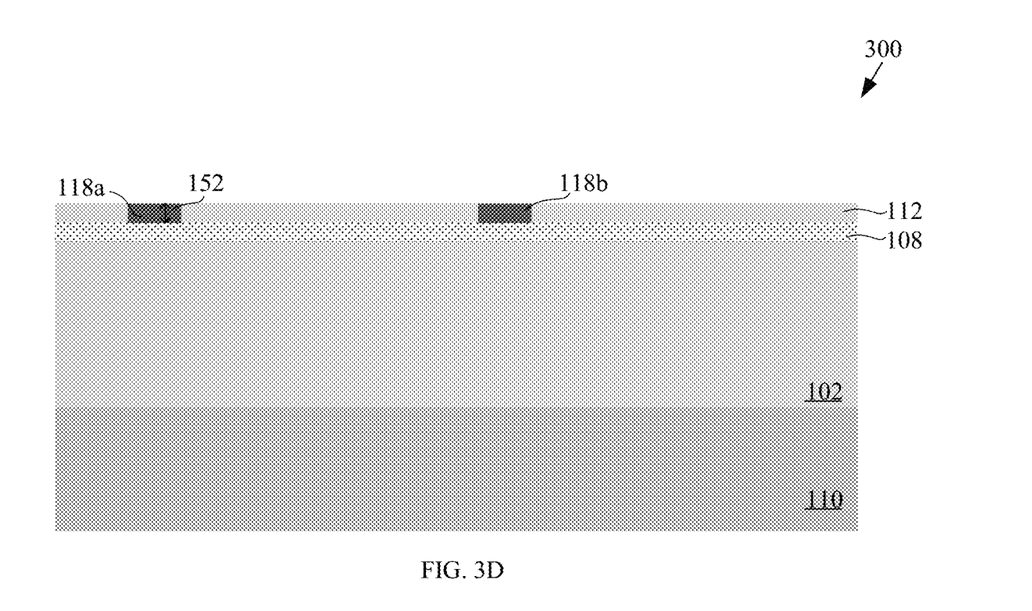
FIG. 3D is a cross-section view of a partially completed structure after partial removal of the conductive material, thereby forming first and second conductive pads, according to embodiments of the disclosure.

FIG. 3D is a cross-section view of a partially completed structure 300 after partial removal of the conductive material 116, thereby forming the first and second conductive pads, 118a and 118b, respectively, according to embodiments of the disclosure. The conductive material 116 may be removed from upper surfaces of the ILD layer 112, and retained within the first and second openings, 114a and 114b, respectively, thereby forming the first and second conductive pads, 118a and 118b, respectively. The removal process may be by chemical mechanical polishing (CMP). The first and second conductive pads, 118a and 118b, respectively, may be separated by the ILD layer 112. The first and second conductive pads, 118a and 118b, respectively, may be disposed on the dielectric etch stop layer 108. In embodiments, the first and second conductive pads, 118a and 118b, respectively, have a thickness 152 range between 300 Å and 600 Å. The first and second conductive pads, 118a and 118b, respectively, may be etch stop layers.

Figure 3E:
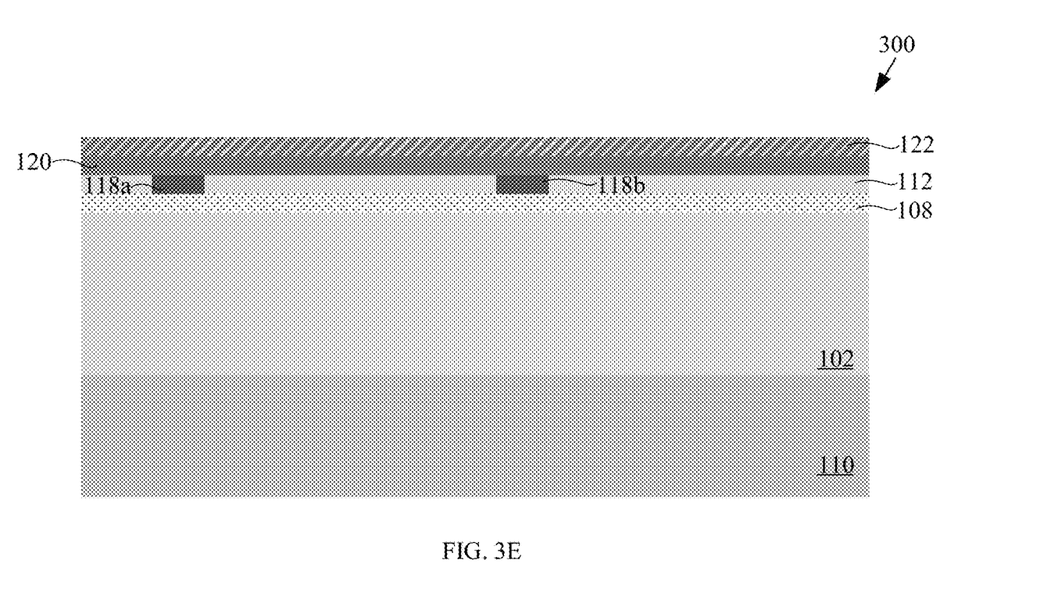
FIG. 3E is a cross-section view of a partially completed structure after deposition of a conductive layer and deposition of a dielectric layer over the conductive layer, according to embodiments of the disclosure.

FIG. 3E is a cross-section view of a partially completed structure 300 after deposition of a conductive layer 120 and deposition of a dielectric layer 122 over the conductive layer 120, according to embodiments of the disclosure. The conductive layer 120 may be deposited over the first and second conductive pads, 118a and 118b, respectively, and over the ILD layer 112. The conductive layer 120 may be made of silicon chromium (SiCr), nickel chromium (NiCr), Ta, TaN, copper nickel chromium (CuNiCr), copper nickel (CuNi), nickel chromium oxide (NiCrO), another suitable material, or a combination thereof. In embodiments, the conductive layer 120 is made of SiCr with additives comprising carbon (C), oxygen (O), nitrogen (N), tungsten (W), nickel (N) or aluminium (Al). The conductive layer 120 and the conductive pads 118a and 118b may be of the same or of different materials. The dielectric layer 122 may be made of silicon nitride, silicon dioxide, doped silicon dioxide, silicon oxynitride, another dielectric material, or a combination thereof. In embodiments, the dielectric layer 122 may be an etch stop layer. In some embodiments, the dielectric layer 122 may be a dielectric etch stop layer. The conductive layer 120 and the dielectric layer 122 may be deposited by CVD, PVD, ALD or any other suitable deposition processes. The conductive layer 120 may have a thickness range between 20 Å to 50 Å.

Figure 3F:
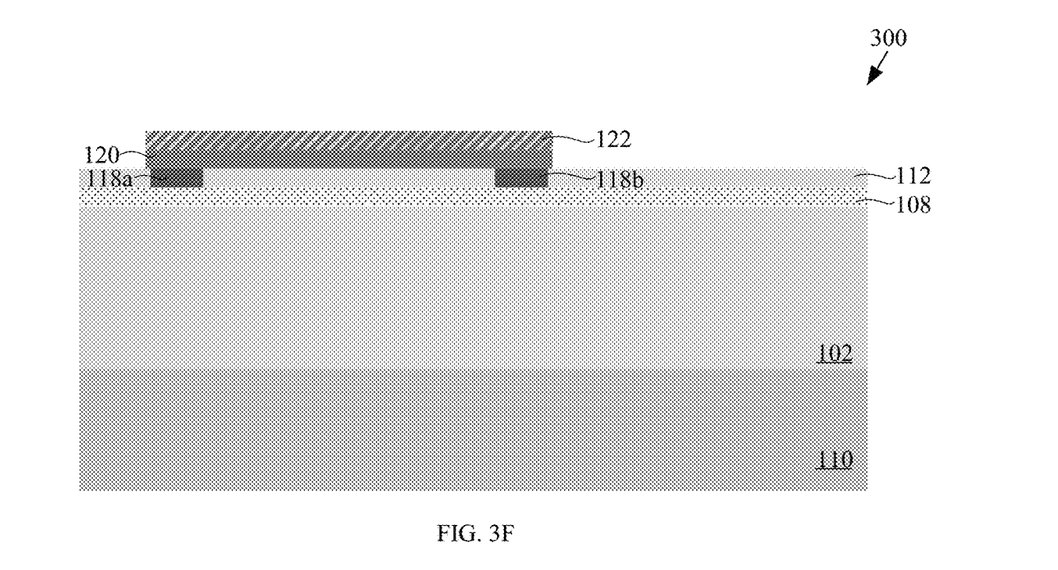
FIG. 3F is a cross-section view of a partially completed structure after removing portions of the conductive layer and the dielectric layer, according to embodiments of the disclosure.

FIG. 3F is a cross-section view of a partially completed structure 300 after removing portions of the conductive layer 120 and the dielectric layer 122, according to embodiments of the disclosure. Although not shown, the removal of portions of the conductive layer 120 and the dielectric layer 122 may include photolithography and etching processes, according to conventional methods. The dielectric layer 122 may protect the conductive layer 120 from etching chemicals used in the etching processes. In embodiments, the dielectric layer 122 has lateral dimensions being substantially similar to the lateral dimensions of the conductive layer 120. The dielectric layer 122 may have a thickness in the range of 100 to 1000 Å.

Figure 3G:
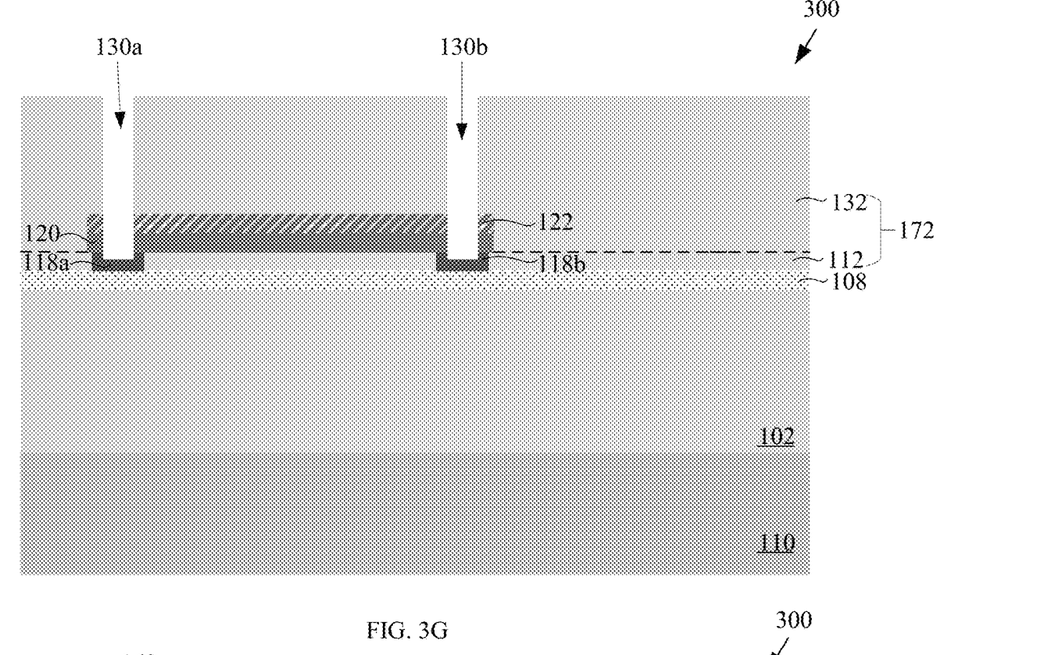
FIG. 3G is a cross-section view of a partially completed structure after deposition of an interlayer dielectric layer and formation of a first and a second via openings, according to embodiments of the disclosure.

FIG. 3G is a cross-section view of a partially completed structure 300 after deposition of an ILD layer 132 and formation of first and second via openings, 130a and 130b, respectively, according to embodiments of the disclosure. The ILD layer 132 may be deposited by CVD, PVD, ALD or any other suitable deposition methods. Although not shown, the formation of the first and second via openings, 130a and 130b, respectively, may include photolithography and etching processes, according to conventional methods. The first and second via openings, 130a and 130b, respectively, may be formed in the ILD layer 132, dielectric layer 122 and conductive layer 120. A bottom portion of the first via opening, 130a, may touch a surface of the first conductive pad 118a and a bottom portion of the second via opening, 130b, may touch a surface of the second conductive pad 118b. The ILD layer 112 and the ILD layer 132 may be collectively referred to as ILD layer 172.

Figure 3H:
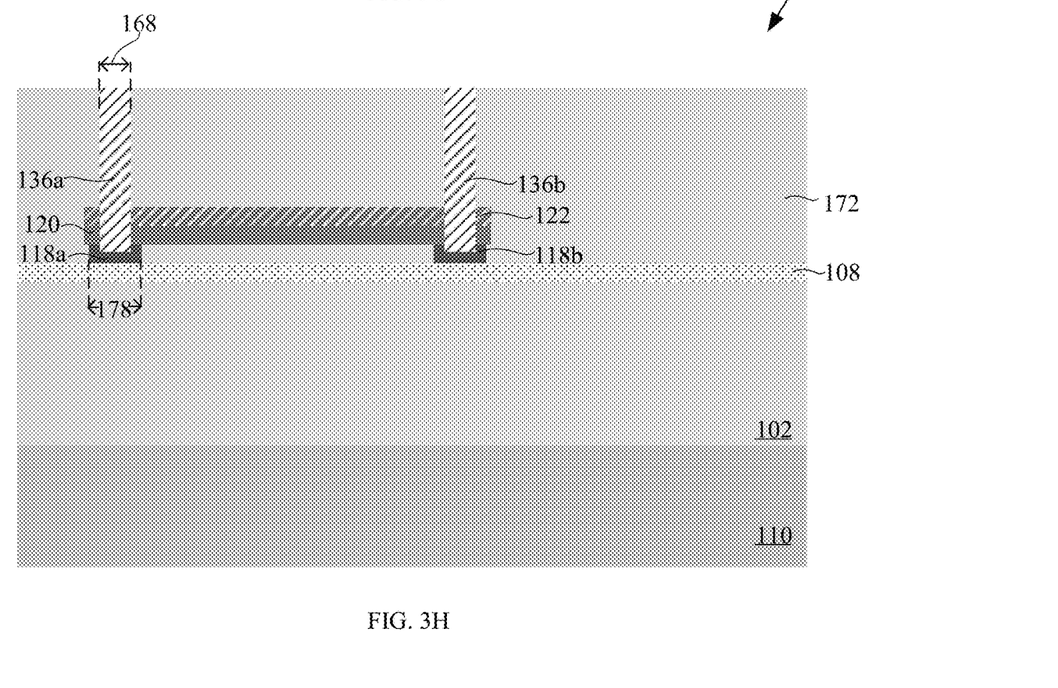
FIG. 3H is a cross-section view of a structure after deposition of a contact metal in the first and second via openings, according to embodiments of the disclosure.

FIG. 3H is a cross-section view of a structure 300 after deposition of a contact metal in the first and second via openings, 130a and 130b, respectively, according to embodiments of the disclosure. The contact metal may be made of copper (Cu), W, another suitable material, or a combination thereof. The contact metal may subsequently be removed from upper surfaces of the ILD layer 172. The removal process may be by CMP. In embodiments, a first via 136a is formed over the first conductive pad 118a and a second via 136b is formed over the second conductive pad 118b. One or more interconnect layers, not shown, may be formed above the first via 136a and the second via 136b.

The vias 136a and 136b may penetrate through the dielectric layer 122 and the conductive layer 120. In embodiments, the first via 136a touches a surface of the first conductive pad 118a and the second via 136b touches a surface of the second conductive pad 118b. In embodiments, the first conductive pad 118a covers a bottom portion of the first via 136a and the second conductive pad 118b covers a bottom portion of the second via 136b.

Referring to FIG. 3H, the structure 300 shows an optional dielectric layer 122 which is not shown in the structures 100 and 200, illustrated in FIGS. 1 and 2, respectively. Referring to FIG. 3H, the structure 300 comprises the substrate 110 with the first and second conductive pads, 118a and 118b, respectively, over the substrate 110. The conductive layer 120 overlies the first and second conductive pads, 118a and 118b, respectively. The conductive layer 120 is continuous between the first and second conductive pads, 118a and 118b, respectively. The dielectric layer 122 is disposed over the conductive layer 120 and the conductive pads, 118a and 118b, respectively. The first via 136a is disposed over the first conductive pad 118a and the second via 136b is disposed over the second conductive pad 118b.

The ILD layer 172 is disposed over the ILD layer 102. The ILD layer 102 is disposed over the substrate 110. The first and second conductive pads, 118a and 118b, respectively, the conductive layer 120, the dielectric layer 122 and the first and second vias, 136a and 136b, respectively, are disposed in the ILD layer 172. The dielectric etch stop layer 108 separates the ILD layer 102 from the ILD layer 172.

The first conductive pad 118a may cover the bottom portion of the first via 136a and the second conductive pad 118b may cover the bottom portion of the second via 136b. The vias 136a and 136b may penetrate through the conductive layer 120. The vias 136a and 136b may penetrate through the dielectric layer 122. The dielectric layer 122 is disposed over the conductive layer 120. A portion of the first via 136a and a portion of the second via 136b may touch the conductive layer 120. A first end portion of the conductive layer 120 may cover a top surface of the first conductive pad 118a and a second end portion of the conductive layer 120 may cover a top surface of the second conductive pad 118b. The conductive layer 120 may electrically connect the first and second conductive pads, 118a and 118b, respectively. The conductive pads 118a and 118b improve electrical coupling between the vias 136a and 136b and the conductive layer 120 by providing a contact area between the vias 136a and 136b and the conductive layer 120. As a width 178 of the first conductive pad 118a may be larger than a width 168 of the first via 136a, an inner portion of the first conductive pad 118a covers a bottom portion of the first via 136a and an outer portion of the first conductive pad 118a may be in contact with the conductive layer 120. For example, the width 178 may be 1.5 to 2 times larger than the width 168.

The conductive pads 118a and 118b may be etch stop layers. The conductive pads 118a and 118b may assist in stopping the etching process during formation of via openings, 130a and 130b, respectively. Process margin for via 136a or 136b fabrication is increased as the conductive pads 118a and 118b are fabricated prior to the formation of the conductive layer 120 and the via openings 130a and 130b. The formation of the via openings 130a and 130b include patterning processes such as etching. Bottom portions of the via openings, 130a and 130b, respectively, and the subsequently formed vias, 136a and 136b, respectively, are covered by the conductive pads, 118a and 118b, respectively. Electrical contact between the vias, 136a and 136b, respectively, and the conductive layer 120 is improved.

The present method, as described above with regard to FIGS. 3A through 3H, may be modified to create alternative embodiments of the structure within the scope of this disclosure. For example, FIGS. 4A to 4F illustrate a fabrication process flow for a structure 400 according to embodiments of the present disclosure. The same reference numbers used in FIGS. 3A to 3H are also used in FIGS. 4A to 4F for identical features.

Figure 4A:
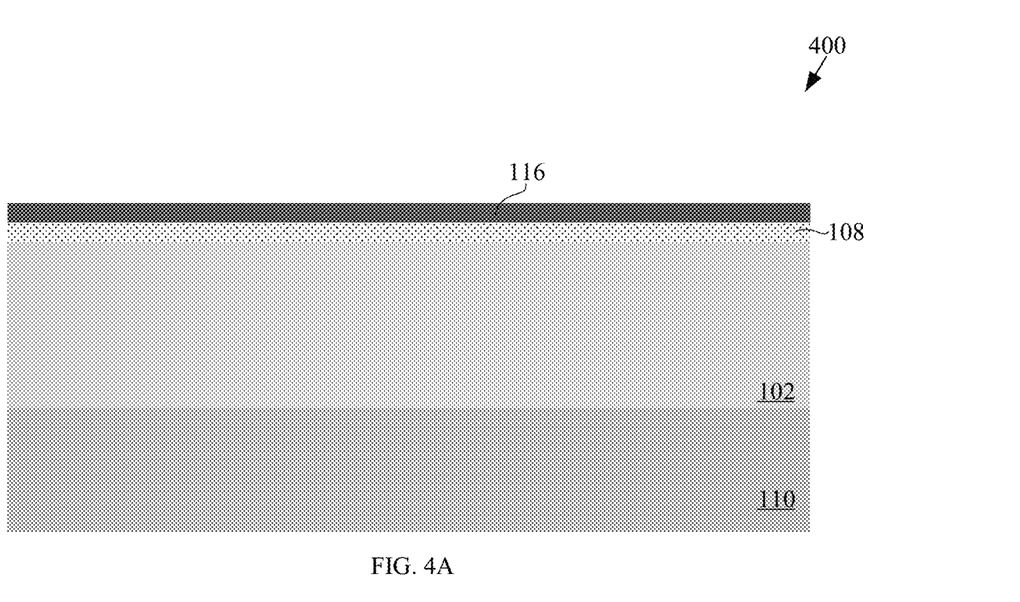
FIG. 4A is a cross-section view of a partially completed structure, according to embodiments of the disclosure.

FIG. 4A is a cross-section view of a partially completed structure 400, according to embodiments of the disclosure. Referring to FIG. 4A, the substrate 110 may be provided. An interlayer dielectric (ILD) layer 102 may be provided over the substrate 110. The dielectric etch stop layer 108 may be deposited over the ILD layer 102. The conductive material 116 may be deposited over the dielectric etch stop layer 108.

Figure 4B:
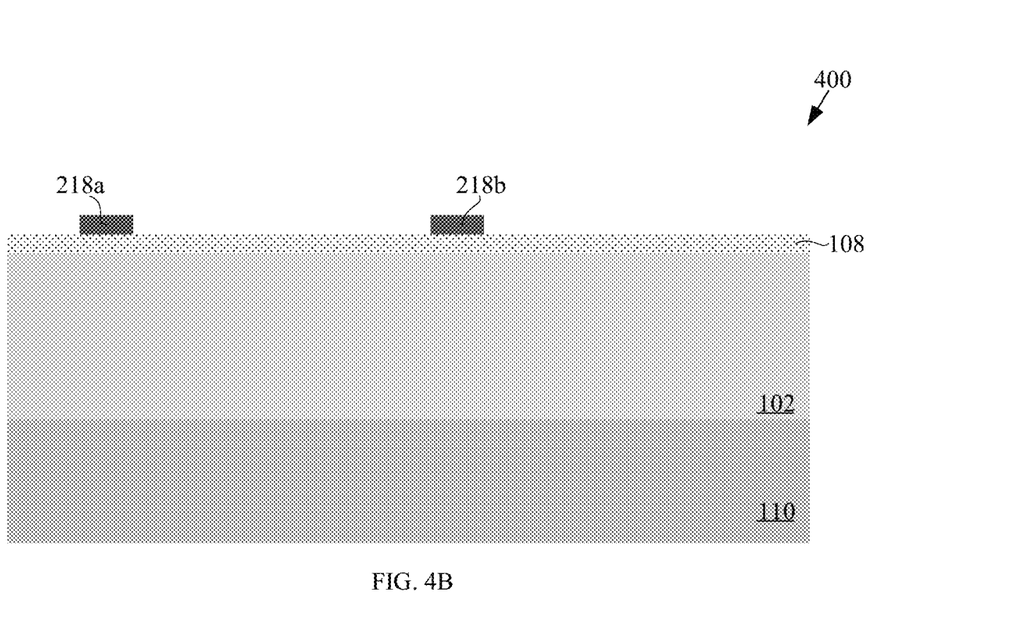
FIG. 4B is a cross-section view of a partially completed structure after removing portions of a conductive material to form first and second conductive pads, according to embodiments of the disclosure.

FIG. 4B is a cross-section view of a partially completed structure 400 after removing portions of the conductive material 116 to form the first and second conductive pads, 218a and 218b, respectively, according to embodiments of the disclosure. Although not shown, the formation of the first and second conductive pads, 218a and 218b, respectively, may include photolithography and etching processes, according to conventional methods.

Figure 4C:
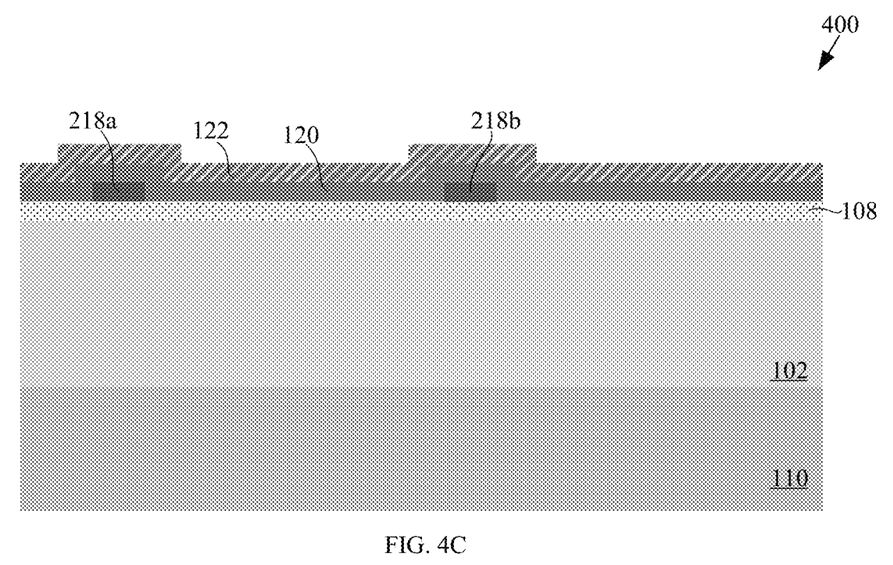
FIG. 4C is a cross-section view of a partially completed structure after deposition of a conductive layer and deposition of a dielectric layer, according to embodiments of the disclosure.

FIG. 4C is a cross-section view of a partially completed structure 400 after deposition of the conductive layer 120 and the deposition of the dielectric layer 122 over the conductive layer 120, according to embodiments of the disclosure. The first conductive pad 218a may be separated from the second conductive pad 218b by a portion of the conductive layer 120.

Figure 4D:
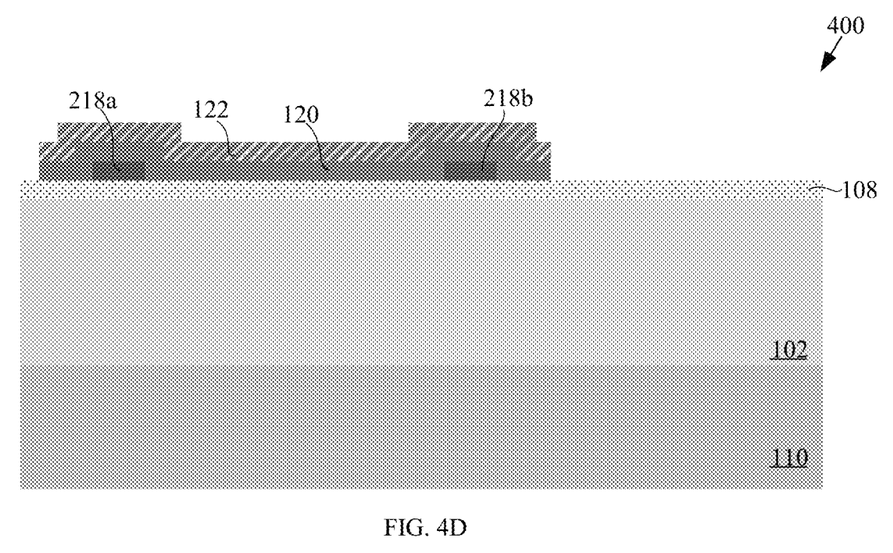
FIG. 4D is a cross-section view of a partially completed structure after removing portions of the conductive layer and the dielectric layer, according to an embodiment of the disclosure.

FIG. 4D is a cross-section view of a partially completed structure 400 after removing portions of the conductive layer 120 and the dielectric layer 122. Although not shown, the removal of the conductive layer 120 and the dielectric layer 122 may include photolithography and etching processes, according to conventional methods. A photolithography process includes depositing a layer of photoresist material followed by conventional exposure and developing to form photoresist patterns. A wet etch or dry etch process may be used to remove portions of the conductive layer 120 and the dielectric layer 122 not covered by the photoresist patterns thereby leaving end portions of the conductive layer 120 and the dielectric layer 122 covering top and side surfaces of the conductive pads 218a and 218b and portions of the conductive layer 120 and the dielectric layer 122 connecting the conductive pads 218a and 218b. Although not shown, the photoresist material may subsequently be removed after the etching process.

Figure 4E:
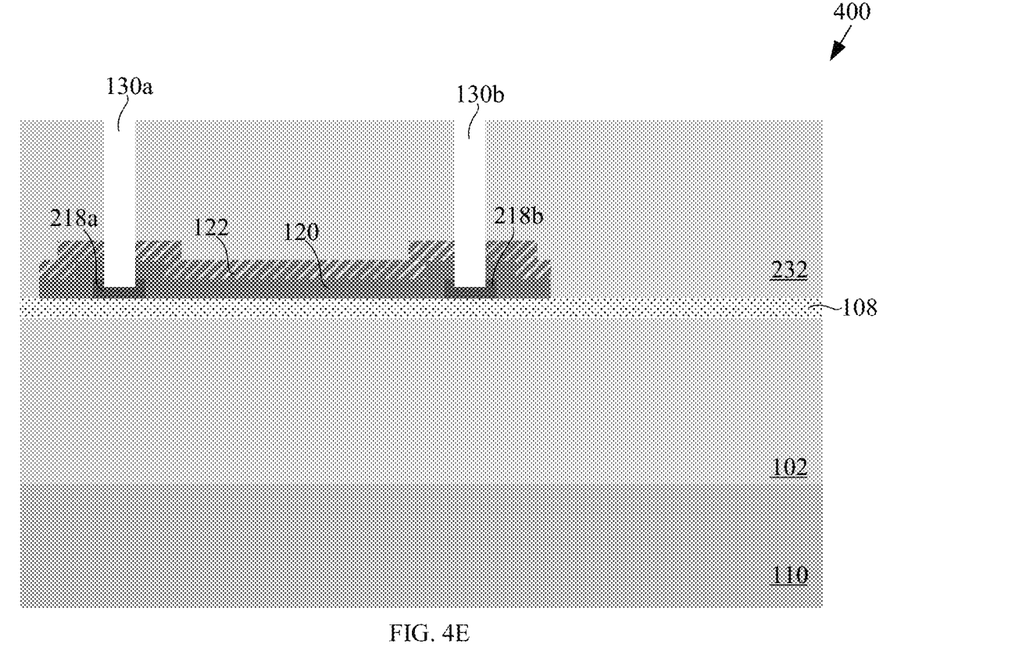
FIG. 4E is a cross-section view of a partially completed structure after deposition of an interlayer dielectric layer and formation of a first and a second via opening, according to embodiments of the disclosure.

FIG. 4E is a cross-section view of a partially completed structure 400 after deposition of an ILD layer 232 and formation of first and second via openings, 130a and 130b, respectively, according to embodiments of the disclosure. The ILD layer 232 may be made of TEOS, silicon dioxide, silicon oxynitride, BSG, PSG, FSG, low-k material, another suitable material or a combination thereof. The ILD layer 232 may be deposited by CVD, PVD, ALD, or any other suitable deposition methods. Although not shown, the formation of the first and second via openings, 130a and 130b, respectively, may include photolithography and etching processes, according to conventional methods.

Figure 4F:
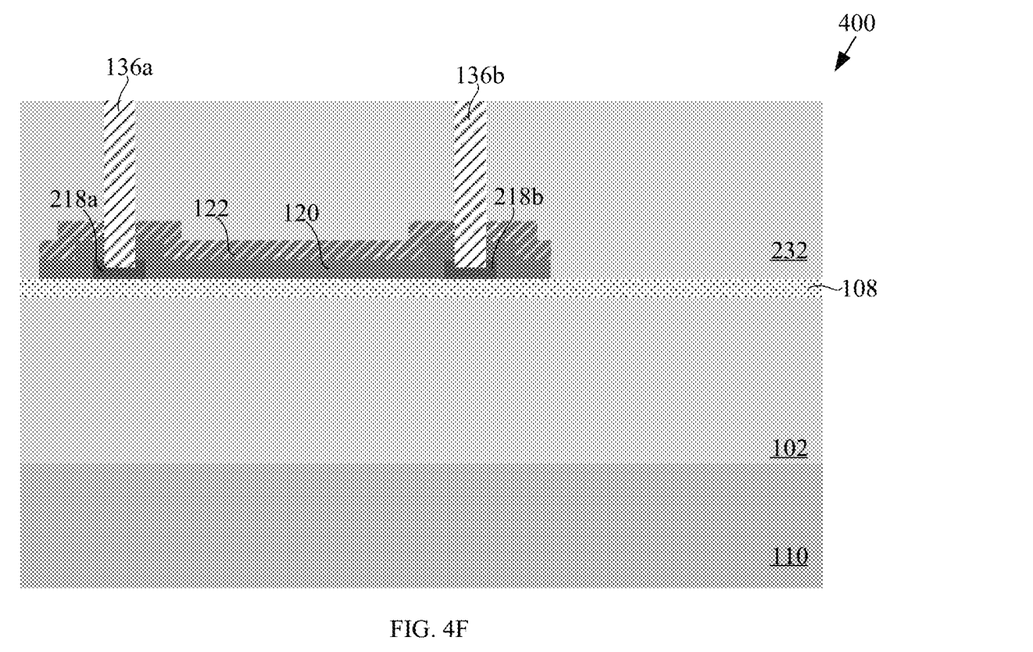
FIG. 4F is a cross-section view of a structure after deposition of a contact metal in the first and second via openings, according to embodiments of the disclosure.

FIG. 4F is a cross-section view of a structure 400 after deposition of a contact metal in the first and second via openings, 130a and 130b, respectively, according to embodiments of the disclosure. The contact metal may subsequently be removed from upper surfaces of the ILD layer 232 by a CMP process. A first via 136a is formed over the first conductive pad 218a and a second via 136b is formed over the second conductive pad 218b.

In contrast to the structure 300 illustrated in FIG. 3H, the structure 400 illustrated in FIG. 4F shows the first conductive pad 218a separated from the second conductive pad 218b by a portion of the conductive layer 120. A first end portion of the conductive layer 120 covers top and side surfaces of the first conductive pad 218a and a second end portion of the conductive layer 120 covers top and side surfaces of the second conductive pad 218b.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed:

1. A structure, comprising:
a substrate;
a conductive pad over the substrate;
a conductive layer overlying the conductive pad;
an etch stop layer over the conductive layer, wherein the etch stop layer is in direct contact with the conductive layer, the etch stop layer is made of silicon nitride or silicon oxynitride;
a first interlayer dielectric layer over and in direct contact with a top surface and side surfaces of the etch stop layer;
a via over the conductive pad, wherein the via penetrates through the conductive layer; and
wherein the via touches a surface of the conductive pad.

2. The structure of claim 1, wherein the via penetrates through the etch stop layer.

3. The structure of claim 1, wherein
the first interlayer dielectric layer is disposed over the substrate;
wherein the conductive pad, the conductive layer, the etch stop layer and the via are disposed in the first interlayer dielectric layer.

4. The structure of claim 3 further comprising:
a dielectric etch stop layer separating the first interlayer dielectric layer from a second interlayer dielectric layer; and
wherein the second interlayer dielectric layer is disposed between the first interlayer dielectric layer and the substrate.

5. The structure of claim 4, wherein the conductive pad is disposed on the dielectric etch stop layer.

6. The structure of claim 1, wherein the conductive pad covers a bottom portion of the via.

7. The structure of claim 1, wherein the conductive pad is an etch stop layer.

8. The structure of claim 1, wherein the conductive pad comprises tantalum nitride (TaN), tantalum (Ta), titanium nitride (TiN), tungsten (W), another suitable material or a combination thereof.

9. A structure, comprising:
a substrate;
a first conductive pad and a second conductive pad over the substrate;
a conductive layer overlying the first conductive pad and the second conductive pad;
an etch stop layer over the conductive layer, wherein the etch stop layer is in direct contact with the conductive layer, the etch stop layer is made of silicon nitride or silicon oxynitride;
a first interlayer dielectric layer over and in direct contact with a top surface and side surfaces of the etch stop layer;
a first via over the first conductive pad and a second via over the second conductive pad, wherein the vias penetrate through the conductive layer; and
wherein the first via touches a surface of the first conductive pad and the second via touches a surface of the second conductive pad.

10. The structure of claim 9, wherein
the first interlayer dielectric layer is disposed over the substrate; and
wherein the first conductive pad is separated from the second conductive pad by a portion of the first interlayer dielectric layer.

11. The structure of claim 9, wherein the first conductive pad is separated from the second conductive pad by a portion of the conductive layer.

12. The structure of claim 9, wherein the vias penetrate through the etch stop layer.

13. The structure of claim 9, wherein a first end portion of the conductive layer covers a top surface of the first conductive pad and a second end portion of the conductive layer covers a top surface of the second conductive pad.

14. The structure of claim 9, wherein a first end portion of the conductive layer covers top and side surfaces of the first conductive pad and a second end portion of the conductive layer covers top and side surfaces of the second conductive pad.

15. A method of fabricating a structure, comprising:
providing a substrate;
forming a first conductive pad over the substrate;
forming a conductive layer overlying the first conductive pad;
forming an etch stop layer over the conductive layer, wherein the etch stop layer is in direct contact with the conductive layer, the etch stop layer is made of silicon nitride or silicon oxynitride;

forming a first interlayer dielectric layer over and in direct contact with a top surface and side surfaces of the etch stop layer;

forming a first via over the first conductive pad, wherein the first via penetrates through the conductive layer; and wherein the first via touches a surface of the first conductive pad.

16. The method of claim 15, further comprising:

forming a second conductive pad over the substrate;

wherein forming the conductive layer further comprises forming the conductive layer overlying the second conductive pad;

wherein forming the etch stop layer further comprises forming the etch stop layer over the first conductive pad and the second conductive pad;

forming a second via over the second conductive pad, wherein the second via penetrates through the etch stop layer and the conductive layer; and wherein the second via touches a surface of the second conductive pad.

17. The method of claim 16, wherein forming the first conductive pad and the second conductive pad further comprises:

forming a dielectric etch stop layer over the substrate;

forming a lower portion of the first interlayer dielectric layer over the dielectric etch stop layer;

forming a first opening and a second opening in the lower portion of the first interlayer dielectric layer; and filling the openings with a conductive material to form the first conductive pad and the second conductive pad, wherein the first conductive pad and the second conductive pad are separated by the lower portion of the first interlayer dielectric layer.

18. The method of claim 17, wherein forming the conductive layer overlying the first conductive pad and the second conductive pad and forming the etch stop layer over the conductive layer and the first conductive pad and the second conductive pad further comprises:

forming the conductive layer over the first conductive pad and the second conductive pad and over the lower portion of the first interlayer dielectric layer;

forming the etch stop layer over the conductive layer and the first conductive pad and the second conductive pad; and removing portions of the conductive layer and the etch stop layer from upper surfaces of the lower portion of the first interlayer dielectric layer to leave end portions of the conductive layer and the etch stop layer covering top surfaces of the conductive pads and portions of the conductive layer and the etch stop layer connecting the conductive pads.

19. The method of claim 18 wherein forming the first via over the first conductive pad and the second via over the second conductive pad further comprises:

forming an upper portion of the first interlayer dielectric layer over the etch stop layer and the lower portion of the first interlayer dielectric layer;

forming a first via opening and a second via opening in the upper portion of the first interlayer dielectric layer, the etch stop layer and the conductive layer to expose the first conductive pad and the second conductive pad; and filling the first via opening and the second via opening with a contact metal to form the first via over the first conductive pad and the second via over the second conductive pad.

* * * * *